United States Patent
Yoon et al.

(10) Patent No.: US 7,994,553 B2
(45) Date of Patent: Aug. 9, 2011

(54) CMOS-BASED PLANAR TYPE SILICON AVALANCHE PHOTO DIODE USING SILICON EPITAXIAL LAYER AND METHOD OF MANUFACTURING THE SAME

(75) Inventors: Yong Sun Yoon, Daejeon (KR); Kun Sik Park, Daejeon (KR); Jong Moon Park, Daejeon (KR); Bo Woo Kim, Daejeon (KR); Jin Yeong Kang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 408 days.

(21) Appl. No.: 12/195,166

(22) Filed: Aug. 20, 2008

(65) Prior Publication Data

US 2009/0146238 A1  Jun. 11, 2009

(30) Foreign Application Priority Data

Dec. 11, 2007  (KR) .................. 10-2007-0128278

(51) Int. Cl.
*H01L 31/062* (2006.01)
(52) U.S. Cl. ................ 257/292; 257/294; 257/E27.132; 438/30; 438/60
(58) Field of Classification Search .................. 257/292, 257/294, E27.132; 438/30, 60
See application file for complete search history.

(56) References Cited

U.S. PATENT DOCUMENTS

| 6,015,721 A | 1/2000 | Kim |
| 7,233,051 B2 | 6/2007 | Morse et al. |
| 2002/0050619 A1* | 5/2002 | Kawaguchi et al. .......... 257/368 |
| 2008/0277749 A1 | 11/2008 | Enichlmair et al. |

FOREIGN PATENT DOCUMENTS

JP  2004-319576 A  11/2004

OTHER PUBLICATIONS

Hyo-Soon Kang et al., "CMOS-compatible 60 GHz Harmonic Optoelectronic Mixer", IEEE, 2007, pp. 233-236.
Kang et al., "CMOS-compatible 60 GHz Harmonic Optoelectronic Mixer", IEEE 2007, pp. 233-236.

* cited by examiner

*Primary Examiner* — Long K Tran

(57) ABSTRACT

A complementary metal-oxide semiconductor (CMOS)-based planar type avalanche photo diode (APD) using a silicon epitaxial layer and a method of manufacturing the APD, the photo diode including: a substrate; a well layer of a first conductivity type formed in the substrate; an avalanche embedded junction formed in the well layer of the first conductivity type by low energy ion implantation; the silicon epitaxial layer formed in the avalanche embedded junction; a doping area of a second conductivity type opposite to the first conductive type, formed from a portion of a surface of the well layer of the first conductivity type in the avalanche embedded junction and forming a p-n junction; positive and negative electrodes formed on the doping area of the second conductivity type and the well layer of the first conductivity type separated from the doping area of the second conductivity type, respectively; and an oxide layer formed on an overall surface excluding a window where the positive and negative electrodes are formed.

3 Claims, 3 Drawing Sheets

CMOS-BASED PLANAR TYPE SILICON AVALANCHE PHOTO DIODE USING SILICON EPITAXIAL LAYER AND METHOD OF MANUFACTURING THE SAME

CROSS-REFERENCE TO RELATED APPLICATIONS

This application claims the priority of Korean Patent Application No. 10-2007-0128278 filed on Dec. 11, 2007, in the Korean Intellectual Property Office, the disclosure of which is incorporated herein by reference.

BACKGROUND OF THE INVENTION

1. Field of the Invention

The present invention relates to a complementary metal-oxide semiconductor (CMOS)-based planar type avalanche photo diode (APD) and a method of manufacturing the same.

2. Description of the Related Art

An avalanche photo diode (APD) indicates a diode using an avalanche phenomenon, in which a layer forming a high electric field in a middle of the diode is required. The layer is called as an embedded junction.

In a conventional APD, the embedded junction is formed by high energy ion implantation. In this case, damages in a silicon lattice occur due to high energy ion implantation, which cause a current leakage, thereby deteriorating breakdown voltage characteristics.

Accordingly, since a conventional silicon APD uses a double side process, it is difficult to manage the conventional APD. In the high energy ion implantation process, damages in a silicon lattice is caused, which are difficult to be adjusted.

The conventional silicon APD will be described with reference to FIG. 1.

FIG. 1 is a cross-sectional view illustrating an APD manufactured according to a conventional method. Referring to FIG. 1, the conventional APD includes a substrate 1-1, an embedded junction 1-2 having junctions 1-2a and 1-2b with the substrate 1-1, a doping area 1-3 having a p-n junction 1-3a, an oxide layer 1-4, a positive electrode 1-5, and a negative electrode 1-6.

In detail, the substrate 1-1 generally uses an n-type silicon substrate rather than a p-type silicon substrate since mobility of electrons greater than that of holes in the APD.

The embedded junction 1-2 is for obtaining avalanche multiplication, and the embedded junction 1-2 is formed by high energy ion implantation and an intermediate layer having a different impurity concentration type from that of the substrate 1-1.

The doping area 1-3 has the p-n junction 1-3a forming a carrier of the APD and is formed by high does ion implantation.

The oxide layer 1-4 is a silicon oxide layer.

The positive electrode 1-5 and the negative electrode 1-6 are formed on a front surface and a rear surface of a wafer, respectively, which are electrodes of the APD. In this case, for ohmic contact to form an electrode on the rear surface, ions having the same type as the substrate 1-1 are implanted into the rear surface. For this, the wafer has to be turned upside down, which is troublesome.

Due to the double side process, it is difficult to manage conventional APDs. Also, conventional methods of manufacturing a CMOS device include forming an n-well and a p-well, setting an active area, and forming a gate oxide layer. Accordingly, when attaching a CMOS circuit to the APD, respective diodes thereof are formed separately from each other and connected to a circuit, which is troublesome.

SUMMARY OF THE INVENTION

An aspect of the present invention provides an APD and a method of manufacturing the same, in which the APD is formed as a planar type of simplifying a double side process of a conventional APD and using a single surface, impurity concentration of an embedded junction is formed to be narrow and steep to increase an avalanche effect, and low energy ion implantation and a silicon epitaxial layer are used to improve reduce damages in a lattice due to high energy ion implantation and improve electrical characteristics, thereby improving and stabilizing operation characteristics such as a current leakage of the diode.

According to an aspect of the present invention, there is provided a complementary metal-oxide semiconductor (CMOS)-based planar type avalanche photo diode using a silicon epitaxial layer, the photo diode including: a substrate; a well layer of a first conductivity type formed in the substrate; an avalanche embedded junction formed in the well layer of the first conductivity type by low energy ion implantation; the silicon epitaxial layer formed in the avalanche embedded junction; a doping area of a second conductivity type opposite to the first conductive type, formed from a portion of a surface of the well layer of the first conductivity type in the avalanche embedded junction and forming a p-n junction; positive and negative electrodes formed on the doping area of the second conductivity type and the well layer of the first conductivity type separated from the doping area of the second conductivity type, respectively; and an oxide layer formed on an overall surface excluding a window where the positive and negative electrodes are formed.

The avalanche embedded junction may be formed by ion implantation of impurities of the second conductivity type opposite to the first conductivity type, with low energy.

The silicon epitaxial layer may be grown at the avalanche embedded junction, then the second conductivity type of embedded junction is formed by auto-doping.

According to another aspect of the present invention, there is provided a method of manufacturing a CMOS-based planar type avalanche photo diode using a silicon epitaxial layer, the method including: forming a well layer of a first conductivity type on a substrate of the first conductivity type; forming a junction area for forming an avalanche embedded junction by ion implantation into the well layer of the first conductivity type; growing the silicon epitaxial layer in the junction area and forming the avalanche embedded junction on top and bottom surfaces of the silicon epitaxial layer; forming a doping area of a second conductivity type opposite to the first conductivity type by ion implantation of impurities of the second conductivity type into a portion of a surface of the well layer of the first conductivity type; and forming positive and negative electrodes on the doping area of the second conductivity type and the well layer of the first conductivity type, separated from the doping area of the second conductivity type, respectively.

The ion implantation may employ a low energy ion implantation process. The growth of the silicon epitaxial layer may be performed by auto-doping.

The forming a junction area for forming an avalanche embedded junction may be performed by ion implantation of impurities of the second conductivity type opposite to the first conductivity type. The avalanche embedded junction may be formed to be thin and uniform by the growth of the silicon epitaxial layer.

The method may further include, before the forming a doping area of a second conductivity type, growing an oxide layer on an overall surface of the well layer of the first conductivity type and forming a window for ion implantation by photo masking the oxide layer.

The method may further include, before the forming positive and negative electrodes, growing an oxide layer on an overall surface of the avalanche photo diode and forming a defined window on the doping area of the second conductivity type and the well layer of the first conductivity type by photo masking the oxide layer.

According to an exemplary embodiment of the present invention, damages in a lattice are reduced by using a silicon epitaxial layer and ion implantation using low energy. Accordingly, a current leakage of a diode is improved and a stable breakdown voltage is obtained, thereby improving electrical characteristics of the diode.

Also, a double side process is simplified and accessibility with a CMOS circuit is improved based on a process of manufacturing the CMOS circuit, thereby improving application fields and availability of the diode.

Also, due to stabilization of an embedded junction, not only an avalanche effect is increased at a low voltage but also it is easy to estimate a result, which allows a circuit design to be easy.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
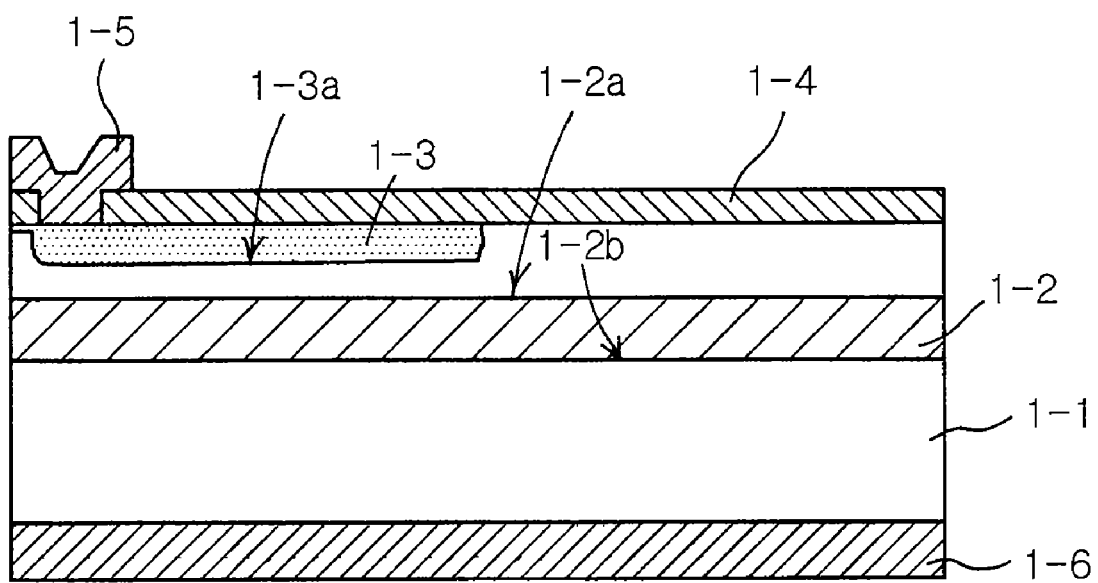
FIG. 1 is a cross-sectional view illustrating a conventional avalanche photo diode (APD)

Exemplary embodiments of the present invention will now be described in detail with reference to the accompanying drawings.

Only, in describing operations of the exemplary embodiments in detail, when it is considered that a detailed description on related well-known functions or constitutions may make essential points of the present invention be unclear, the detailed description will be omitted.

In the drawings, the same reference numerals are used throughout to designate the same or similar components.

A configuration and a complementary metal-oxide semiconductor (CMOS)-based planar type avalanche photo diode (APD) using a silicon epitaxial layer 2-4 and a method of manufacturing the APD, according to an exemplary embodiment of the present invention, will be described with reference to the attached drawings.

Figure 2:
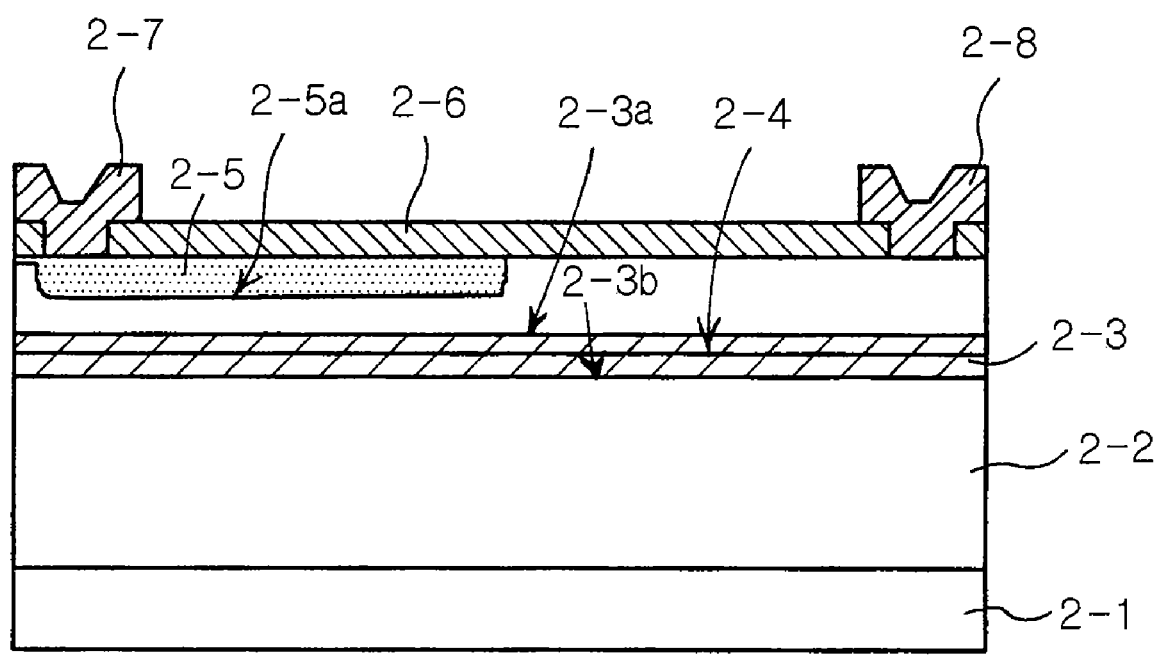
FIG. 2 is a cross-sectional view illustrating a CMOS-based planar type APD using a silicon epitaxial layer, according to an exemplary embodiment of the present invention.

FIG. 2 is a cross-sectional view illustrating the APD according to an exemplary embodiment of the present invention.

The APD includes a substrate 2-1, a well layer 2-2 formed on the substrate 2-1, an avalanche embedded junction 2-3 formed on the well layer 2-2, the silicon epitaxial layer 2-4 formed on the avalanche embedded junction 2-3, a doping area 2-5 having a p-n junction 2-5a formed on the well layer 2-2, and positive and negative electrodes 2-7 and 2-8.

In detail, the substrate 2-1 may be n-type or p-type according to process conditions suitable for CMOS device standards, in association with a CMOS device.

The well layer 2-2 may be n-type or p-type according to well formation standards of the CMOS device.

The avalanche embedded junction 2-3 has junctions 2-3a and 2-3b formed in the well layer 2-2 by ion implantation of impurities having a different type from that of the well layer 2-2, with low energy, thereby reducing damages in a silicon lattice due to ion implantation.

The silicon epitaxial layer 2-4 is formed in the avalanche embedded junction 2-3 by auto-doping. The magnitude of a breakdown voltage may be freely controlled by controlling a thickness of the silicon epitaxial layer 2-4.

That is, since the silicon epitaxial layer 2-4 is formed by auto-doping, the avalanche embedded junction 2-3 is formed to be narrow and steep. Accordingly, an avalanche effect may be increased at a low voltage and a current gain of the diode may be increased.

The p-n junction 2-5a is a junction providing a carrier, which is formed by ion implantation of impurities having a different type from that of the avalanche embedded junction 2-3. The positive and negative electrodes 2-7 and 2-8 are formed in windows formed separated from each other on a silicon oxide layer, respectively.

A method of manufacturing a CMOS-based planar type APD using a silicon epitaxial layer 3-4, according to an exemplary embodiment of the present invention, will be described.

FIGS. 3A to 3D are cross-sectional views illustrating the method of manufacturing the APD according to an exemplary embodiment of the present invention. In this case, the method employs process conditions of a CMOS device to take aim integration with a CMOS circuit.

Figure 3A:
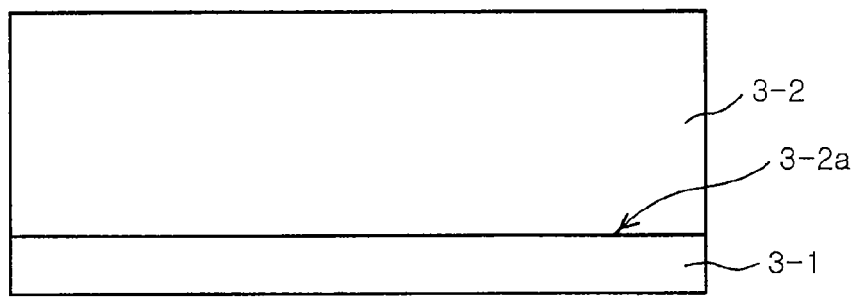
FIGS. 3A to 3D are cross-sectional views illustrating a method of manufacturing the CMOS-based planar type APD of FIG. 2, according to an exemplary embodiment of the present invention.

Referring to FIG. 3A, a well layer 3-2 of a first conductivity type that may be p or n type is formed on a silicon substrate 3-1, which is essentially required to link with a CMOS device. Reference numeral 3-2a indicates a junction interface between the well layer and the silicon substrate 3-1. Since the well layer 3-2 is formed via a general ion implantation process, a detailed description thereof will be omitted.

Figure 3B:
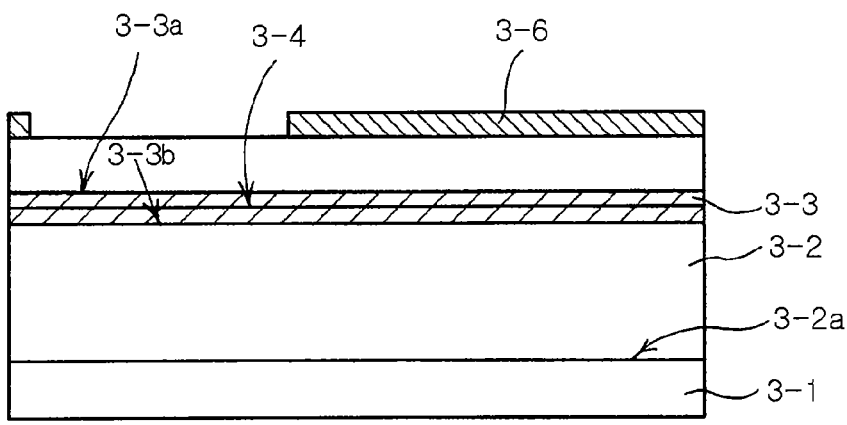

Referring to FIG. 3B, ions of impurities are implanted into a surface of the well layer 3-2 formed in the silicon substrate 3-1, with low energy, thereby forming an avalanche embedded junction 3-3 having junctions 3-3a and 3-3b in the well layer 3-2. The silicon epitaxial layer 3-4 is grown in the avalanche embedded junction 3-3.

The silicon epitaxial layer 3-4 is grown with a small thickness by auto-doping. Accordingly, impurities are distributed into the silicon epitaxial layer 3-4, thereby forming the avalanche embedded junction 3-3 to be thin and uniform. Definitely, the reference numeral 3-4 indicates a point of initially forming the silicon epitaxial layer.

The silicon epitaxial layer 3-4 may be formed by not only selectively growing an epitaxial layer but also controlling doping profile of the impurities by an in-situ process, thereby forming impurity concentration distribution of a junction between the avalanche embedded junction 3-3 and the silicon epitaxial layer 3-4 to be steep and more stable structure. Accordingly, electrical characteristics are improved and characteristics of a device itself are stably shown.

That is, impurity concentration of the avalanche embedded junction 3-3 is formed to be narrow and steep by using the silicon epitaxial layer 3-4, thereby controlling a breakdown voltage by using a thickness of the silicon epitaxial layer 3-4 and increasing a current gain of the device by increasing the avalanche effect at a low voltage. This is very important when applying to various types of circuits, which may be easily estimated via a simple simulation.

An oxide layer 3-6 is grown at an overall surface of the well layer 3-2 and an area for ion implantation is defined to form a p-n junction of the planar type APD by photo masking.

Figure 3C:
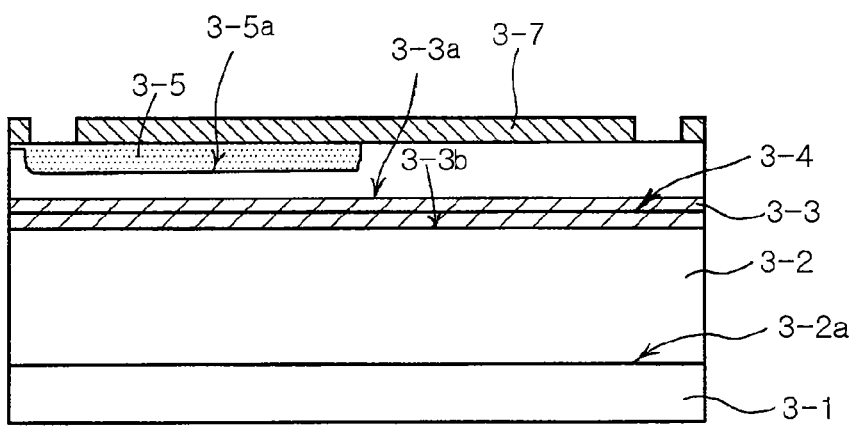

Referring to FIG. 3C, a doping area 3-5 of a second conductivity type (n or p) opposite to the first conductivity type, the doping area 3-5 having a p-n junction 3-5a, is formed on the ion implantation area to from p-n junction (n+-p junction or p+-n junction), the ion implantation area defined in FIG. 3B, by ion implantation. An oxide layer 3-7 is grown at a surface to form an electrode.

Open windows are formed on the doping area 3-5 and the well layer 3-2 by photo masking the newly grown oxide layer 3-7.

Figure 3D:
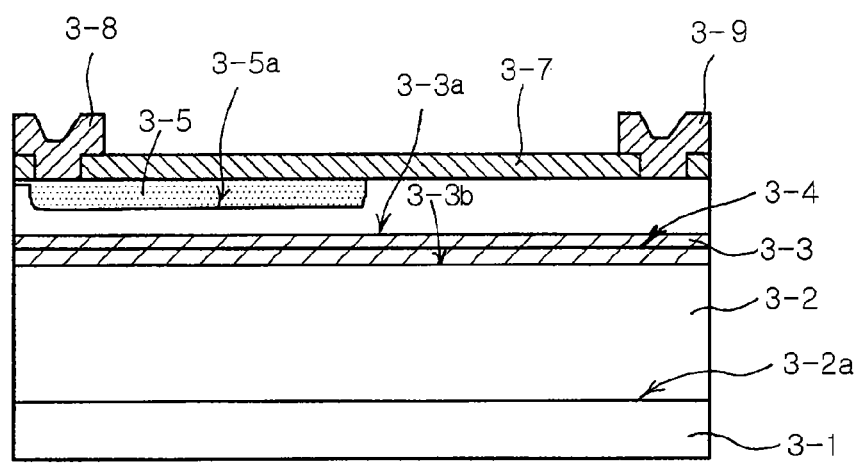

Referring to FIG. 3D, a positive electrode 3-8 is formed by sputtered a metal layer on the open window on the doping area 3-5 and the well layer 3-2. A negative electrode 3-9 is formed on the open window on the well layer 3-2, separated from the positive electrode 3-8. That is, a conventional both surface electrode is formed at a single surface, thereby increasing accessibility with a CMOS circuit. A well set-up CMOS process is used without adjustment to manufacture the electrodes on the single surface.

Accordingly, since the method of manufacturing the planar type APD according to an exemplary embodiment of the present invention employs process conditions of a CMOS device, as it is, a difficulty of the process is very smaller than a conventional device. Also, the APD is manufactured as a planar type, thereby easily integrating with a conventional CMOS process. According to an object of use, the APD is designed together with a CMOS circuit, thereby broadening application fields and removing a limitation on the application fields.

Also, according to the APD manufacturing method according to an exemplary embodiment of the present invention, since the planar type APD is formed while sharing n-well or p-well in the CMOS process, the form of a carrier may be freely controlled such as electrons or holes, thereby increasing applicability thereof. That is, an APD using holes is manufactured in the n-well and an APD using electrons is manufactured in the p-well.

Also, according to the APD manufacturing method according to an exemplary embodiment of the present invention, an avalanche embedded junction is formed by ion implantation with low energy and a silicon epitaxial layer is formed by using auto-doping phenomenon, thereby obtaining stable and uniform breakdown voltage characteristics. Also, magnitude of a breakdown voltage may be freely controlled by controlling a thickness of the silicon epitaxial layer.

While the present invention has been shown and described in connection with the exemplary embodiments, it will be apparent to those skilled in the art that modifications and variations can be made without departing from the spirit and scope of the invention as defined by the appended claims.

What is claimed is:

1. A complementary metal-oxide semiconductor (CMOS)-based planar type avalanche photo diode using a silicon epitaxial layer, the avalanche photo diode comprising:
    a substrate;
    a well layer of a first conductivity type formed in the substrate;
    an avalanche embedded junction formed in the well layer of the first conductivity type by low energy ion implantation;
    the silicon epitaxial layer formed in the avalanche embedded junction;
    a doping area of a second conductivity type opposite to the first conductive type, formed from a portion of a surface of the well layer of the first conductivity type in the avalanche embedded junction and forming a p-n junction;
    positive and negative electrodes formed on the doping area of the second conductivity type and the well layer of the first conductivity type separated from the doping area of the second conductivity type, respectively; and
    an oxide layer formed on an overall surface excluding a window where the positive and negative electrodes are formed.

2. The avalanche photo diode of claim 1, wherein the avalanche embedded junction is formed by ion implantation of impurities of the second conductivity type opposite to the first conductivity type, with low energy.

3. The avalanche photo diode of claim 1, wherein the silicon epitaxial layer is grown at the avalanche embedded junction of the second conductivity type by auto-doping.

* * * * *